US006501292B1

(12) United States Patent
Nack

(10) Patent No.: US 6,501,292 B1
(45) Date of Patent: Dec. 31, 2002

(54) CMOS CIRCUIT FOR MAINTAINING A CONSTANT SLEW RATE

(75) Inventor: David S. Nack, Roseville, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/517,783

(22) Filed: Mar. 2, 2000

(51) Int. Cl.[7] .............................................. H03K 17/16
(52) U.S. Cl. ............................. 326/27; 326/83; 326/86
(58) Field of Search ............................. 326/26, 27, 30, 326/83, 86, 87; 327/170

(56) References Cited

U.S. PATENT DOCUMENTS

| | | | | |
|---|---|---|---|---|
| 4,922,131 A | * | 5/1990 | Anderson et al. ............ 326/126 |
| 5,140,191 A | * | 8/1992 | Nogle et al. ................. 326/126 |
| 6,087,847 A | * | 7/2000 | Mooney et al. ................ 326/30 |
| 6,111,445 A | * | 8/2000 | Zerbe et al. ................. 327/231 |
| 6,278,306 B1 | * | 8/2001 | Ang et al. ..................... 326/87 |
| 6,288,563 B1 | * | 9/2001 | Muljono et al. ............... 326/30 |

* cited by examiner

Primary Examiner—Don Phu Le
(74) Attorney, Agent, or Firm—Fish & Richardson P.C.

(57) ABSTRACT

A CMOS circuit maintains a constant slew rate over a range of environmental or process conditions. The circuit includes an output stage having a slew rate that is a function of the switching characteristic of the output stage and a bias current. A current adjustment stage adjusts the bias current in view of the switching characteristic to maintain a substantially constant slew rate. The slew rate of the output stage may be tuned to a desired level. A clamp may also be used to limit the voltage variations at the output stage.

12 Claims, 2 Drawing Sheets

CMOS CIRCUIT FOR MAINTAINING A CONSTANT SLEW RATE

TECHNICAL FIELD

This invention relates to CMOS circuits, and more particularly to techniques for maintaining a constant slew rate within a CMOS circuit.

BACKGROUND

Complementary metal oxide semiconductor (CMOS) circuits are subject to a slew rate that typically varies with environmental conditions and/or process parameters. A slew rate that varies over a large range is typically undesirable for many applications such as an Ethernet line driver. Therefore, CMOS circuits are typically modified to maintain a substantially constant slew rate.

Many techniques have been employed to maintain a substantially constant slew rate. A few of these techniques include trimming the circuit with fuses, the use of an oversampled waveform synthesizer, or using a replica bias circuit that is slaved to a phase locked loop. However, each of the previous techniques has disadvantages including, but not limited to, increasing the complexity of the circuit and having a corresponding increase in manufacturing cost.

Each transistor that is fabricated on the same integrated circuit chip typically has similar switching characteristics and behavior. This results from all of the devices on the same chip being fabricated at the same time with the same process parameters. As such, the circuits operate in a matched manner over wide variations in power supply voltage, process parameters (threshold voltage, channel length, etc.), and temperature. This consistent behavior allows the circuit of the present invention to control the relative current flow as will be described below.

DESCRIPTION OF DRAWINGS

Features and advantages of the present invention will become apparent upon reading the following detailed description and upon reference to the accompanying drawings.

DETAILED DESCRIPTION

Figure 1:
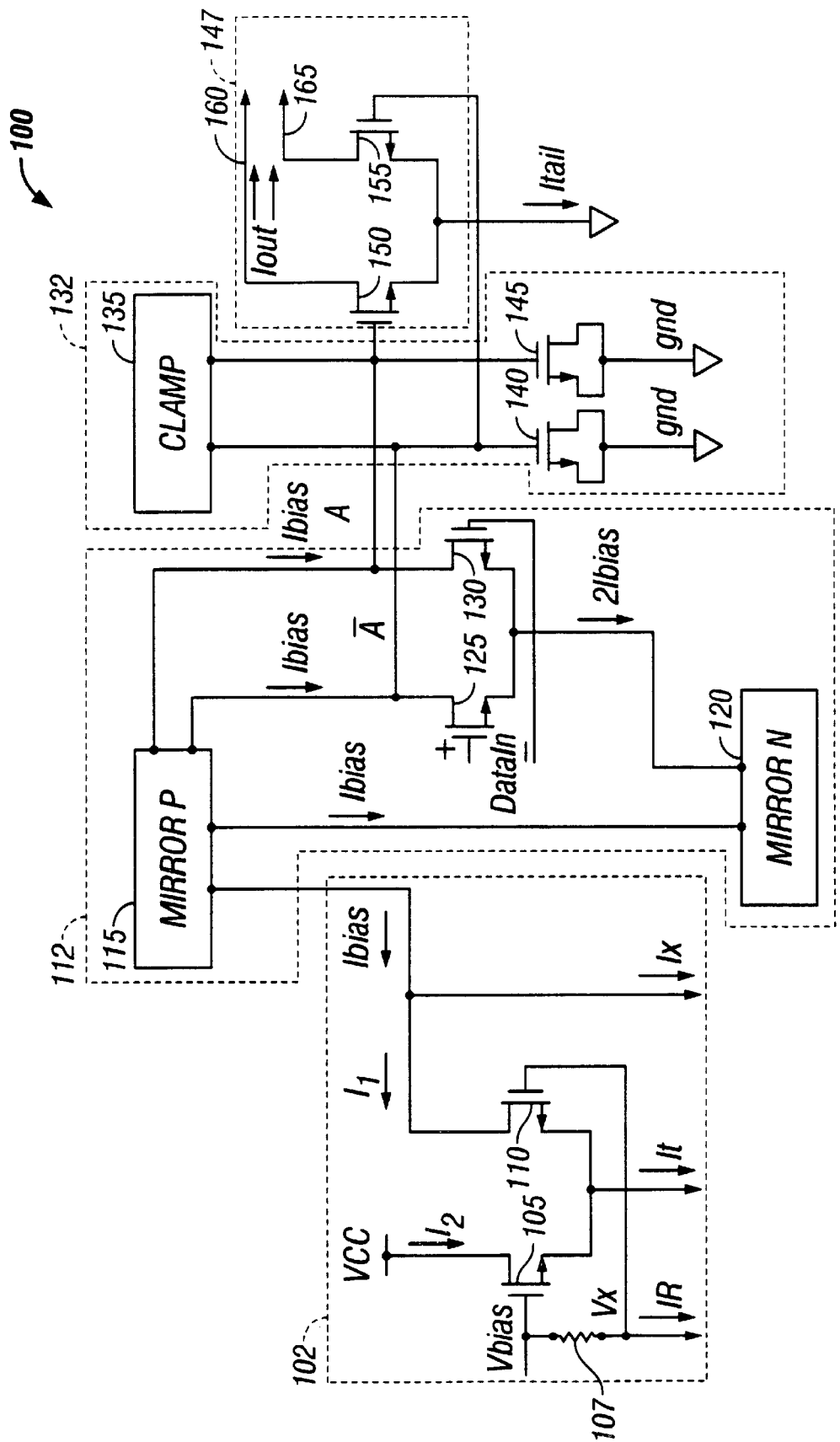
FIG. 1 is a schematic diagram of the CMOS circuit to achieve a constant slew rate according to the present invention.

A circuit 100 for maintaining a constant slew rate is disclosed in FIG. 1. The circuit 100 includes a resistor 107, transistors 105, 110, 125, 130, 150, 155, current mirrors 115, 120, a clamp 135, and capacitors 140, 145. The gate of the transistor 105 is connected to a bias voltage $V_{bias}$ and to a first terminal of the resistor 107. The drain of the transistor 105 is connected to a control voltage $V_{cc}$. The source of the transistor 105 is connected to the source of the transistor 110 and to circuit ground. The gate of the transistor 110 is connected to a second terminal of the resistor 107 and to circuit ground. The drain of the transistor 110 is connected to the current mirror 115 and to circuit ground.

The drain of the transistor 125 is connected to the, current mirror 115, to the clamp 135, to the first terminal of the capacitor 140, and to the gate of the transistor 155. The gate of the transistor 125 is connected to a data input terminal. The source of the transistor 125 is connected to the source of the transistor 130 and to the current mirror 120. The current mirror 120 is connected to the current mirror 115.

The drain of the transistor 130 is connected to the current mirror 115, to the clamp 135, to the first terminal of the capacitor 145, and to the gate of the transistor 150. The gate of the transistor 130 is connected to the data input terminal.

The second terminals of the capacitors 140, 145 are connected to circuit ground. The drain of the transistor 150 is connected to a circuit output terminal 160. The drain of the transistor 155 is connected to a circuit output terminal 165. The source of the transistor 150 is connected to the source of the transistor 155 and to circuit ground.

The circuit 100 maintains a relatively constant slew rate by adjusting $I_{bias}$ with the switching characteristic ($V_{on}$) of the transistors 150, 155. The adjustments of $I_{bias}$ are made in the current adjustment stage 102. In the current adjustment stage 102, a bias voltage $V_{bias}$ is applied to the gate the transistor 105, and another bias voltage $V_X$ is applied to the gate of the transistor 110. The bias voltage $V_X$ is equal to the bias voltage $V_{bias}$ minus the voltage drop across the resistor 107. The bias voltages $V_{bias}$ and $V_X$ determines the transitions of the transistors 105 and 110, respectively.

For a given temperature, the transistors 105, 110 have a specific switching characteristic $V_{on}$. The switching characteristic $V_{on}$ varies as a function of temperature and may also be affected during the fabrication process. For example, at a first temperature, the switching characteristic $V_{on}$ may result in a large amount of current $I_2$ flowing through the transistor 105, while a small amount of current $I_1$ flows through the transistor 110. At the first temperature, the total amount of amount of current $I_t$ flowing through the transistors 105, 110 may be split so that approximately 80% of the current is supplied by $I_2$ and approximately 20% of the current is supplied by $I_1$.

As the temperature increases, the switching characteristic $V_{on}$ is modified so more current $I_1$ flows through the transistor 110. For example, at a second temperature which is higher than the first temperature, the amount of current $I_t$ flowing through both transistors 105, 110 may be split so that 60% of the current is supplied by $I_2$ and 40% of the current is supplied by $I_1$. As described above, each transistor fabricated on the same integrated circuit chip typically has similar switching characteristics and behavior. The switching characteristics of the transistors 105, 110 are therefore matched to the switching characteristics of the transistors 150, 155. Therefore, the change in relative current flow through the transistors 105, 110 is approximately the same as the change in relative current flow through the transistors 150, 155 for similar environmental and process conditions.

The current $I_{bias}$ is equal to the current $I_1$ combined with the current $I_X$. The current Ix is maintained as a constant, and therefore any change in the current $I_1$ results in a corresponding change to the current $I_{bias}$. Thus, as the switching characteristics $V_{on}$ of the transistors 105, 110 adjusts the current $I_1$, the current $I_{bias}$ will also adjust.

The input stage 112 of the circuit 100 receives data input signals at the gates of the transistors 125, 130. The data input signals are typically digital signals. The input data signals control the switching of the transistors 125, 130. A current mirror 115 supplies the current $I_{bias}$ to the drains of each of the transistors 125, 130. The sources of the transistors are connected together to supply a current $2I_{bias}$ to the current mirror 120.

A voltage $\overline{A}$ exists at the drain of the transistor 125. A voltage A exists at the drain of the transistor 130. When the input data signals cause the voltages $\overline{A}$ and A to be equal, current is divided so that it flows equally through the transistors 150, 155. As the input data signals change, the voltages $\overline{A}$ and A also change. The variation in the voltages $\overline{A}$ and A cause differing amounts of current to flow through the transistors 150, 155.

The tuning stage 132 of the circuit adjusts and limits the slew rate. The tuning stage 132 includes the capacitors 140, 145 and the clamp 135. The capacitors 140, 145 are preferably metal or gate oxide capacitors that have small dependence on process variation and no dependence on temperature deviation.

Because the input data signals are digital, the transistors 125, 130 can switch very fast. The capacitors 140, 145 are used to slow down the speed at which the transistors 125, 130 switch. The amount of time needed to charge the capacitors 140, 145 slows down the switching time of the transistors 125, 130, and thus controls the slew rate. The value of the capacitors 140, 145 may be selected to tune the slew rate. For example, a slew rate of approximately 4 nanoseconds may be desired. With the digital input signal, the transistors 125, 130 switch at a rate in the picosecond range. By selecting the appropriate value for the capacitors 140, 145, the switching rate of the transistors 125, 130 may be adjusted until the desired slew rate is obtained.

The tuning stage 132 also ensures the voltage swing at the gates of the transistors 150, 155 does not become too large. As stated above, if the voltages $\overline{A}$ and A are equal, current flows equally through the transistors 150, 155. After the transistors 150, 155 fully switch, it is not desirable for the voltages $\overline{A}$ and A further separate. Therefore, after the transistors 150, 155 are fully switched, the clamp 135 limits the value of the voltages $\overline{A}$ and A to ensure the variation does not become too large.

The output stage 147 provides output signals 160, 165 from the circuit 100. The output signal 160 is at the drain of the transistor 150 and the output signal 165 is at the drain of the transistor 155. The output signals 160, 165 are determined by the current flow through the transistors 150, 155. The sources of the transistors 150, 155 are tied together, and the combined current from the sources is represented by $I_{tail}$.

The current $I_{bias}$ tracks the switching characteristic $V_{on}$ of the transistors 150, 155 such that the output currents 160, 165 has a rise time that is nearly independent of process and temperature variations. The slew rate of the output 160, 165 is shown in given by:

$$\frac{I_{out}}{T} \propto \frac{I_{bias} I_{tail}}{C V_{on}}$$

The variable $V_{on}$ is the switching characteristic of the transistors 150, 155. Because $I_{tail}$ can be a constant current, and C (the capacitors 140, 145) can be implemented with metal or gate oxide capacitors that have small dependence on process variation and no dependence on temperature deviation, the ratio of $I_{bias}/V_{on}$ becomes the dominant component of the slew rate. The $I_{bias}/V_{on}$ ratio is defined by:

$$\frac{I_{bias}}{V_{on}} = \sqrt{\frac{\beta}{I_t}} \left(\frac{I_t}{2} + I_x\right) - V\beta \sqrt{\frac{1}{2} - \frac{V^2 \beta}{4 I_t}}$$

$$\text{where } V_{on} = \sqrt{\frac{I_t}{\beta}} = V_{gs} - V_t$$

The variable beta ($\beta$) defines the variations due to process and temperature. For a typical CMOS fabrication process, a beta range of 4 is equivalent to the full range of process variation (from slow to fast process corners) and the full range of temperature (from 0 to 130° C.). For beta varying by a factor of four due to process and temperature, and assuming $I_t$=1 ampere, V=0.5 volts, and $V_{on}$ varies form 0.5 to 1.0 volt, the slew rate is as follows:

$$\text{For } \beta = 1 \frac{I_{bias}}{V_{on}} = X + 0.169$$

$$\text{For } \beta = 4 \frac{I_{bias}}{V_{on}} = 2X$$

Therefore, if $I_X$=a constant current of 0.169, the $I_{bias}/V_{on}$ ratio is:

$$\frac{I_{bias}}{V_{on}} = 0.669 \sqrt{\beta} - \frac{\beta}{2} \sqrt{\frac{1}{2} - \frac{\beta}{16}}$$

Figure 2:
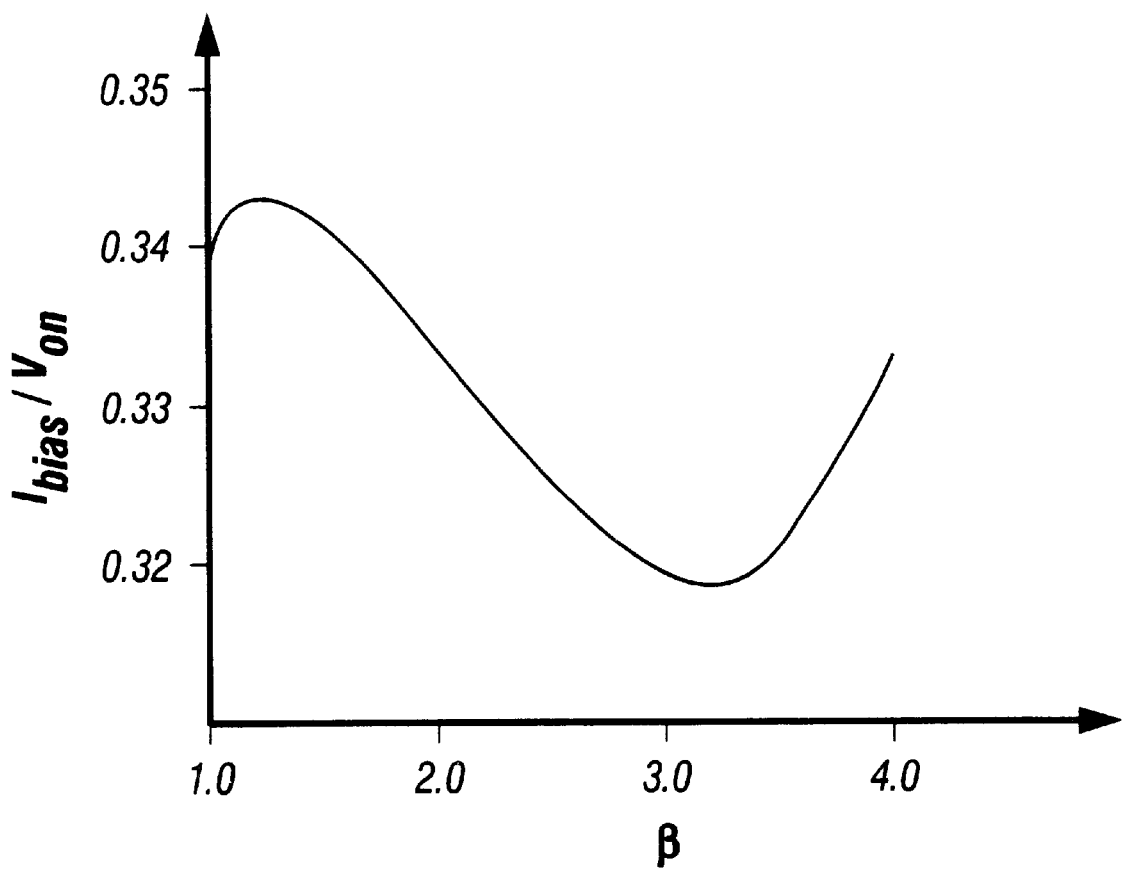
FIG. 2 is a graph of the variation of the $I_{bias}/V_{on}$ ratio over a range of beta conditions for the circuit of FIG. 1.

This equation is present graphically in FIG. 2. In FIG. 2, the $I_{bias}/V_{on}$ ratio is shown to only vary slightly over the beta range of 1 to 4. For the beta range of 1 to 4, the $I_{bias}/V_{on}$ ratio only changes by approximately 6%. Because the $I_{bias}/V_{on}$ ratio is the dominant component of the slew rate, the slew rate also does not vary significantly over the beta range.

Numerous variations and modifications of the invention will become readily apparent to those skilled in the art. Accordingly, the invention may be embodied in other specific forms without departing from its spirit or essential characteristics.

What is claimed is:

1. A circuit comprising:
   an input stage which receives input data;
   a current adjustment stage which adjusts a bias current;
   a tuning stage, including at least one capacitor defining a slew rate range;
   an output stage which maintains a substantially constant slew rate based on the variations in the bias current; and
   a clamp which limits an input voltage to the output stage.

2. The circuit of claim 1, wherein the current adjustment stage includes a first plurality of transistors and the output stage includes a second plurality of transistors.

3. The circuit of claim 2, wherein the first plurality of transistors have a switching characteristic approximately equal to a switching characteristic of the second plurality of transistors.

4. The circuit of claim 1, wherein the circuit is a CMOS circuit.

5. The circuit of claim 1, wherein the tuning stage limits the voltage at an input of the output stage.

6. The circuit of claim 5, wherein the tuning stage includes a voltage clamp to limit the voltage at an input of the output stage.

7. A circuit comprising:
   a first plurality of transistors having a first switching characteristic and a first current;
   a second plurality of transistors having a second switching characteristic and a second current, the first switching characteristic being approximately equal to the second switching characteristic and the first current controlling the second current;
   a current adjustor which alters the first current; and
   a clamp to limit the voltage at the gates of the second plurality of transistors.

8. The circuit of claim 7, wherein the first current is adjusted based on environmental changes.

9. The circuit of claim 7, wherein adjusting the first current controls the slew rate of the second plurality of transistors.

10. The circuit of claim 9, wherein the slew rate of the second plurality of transistors defines the flow of current over time through the second plurality of transistors.

11. The circuit of claim 7, further comprising a slew rate tuner.

12. The circuit of claim 11, wherein the slew rate tuner includes at least one capacitor.

* * * * *